(12) United States Patent
Lee

(10) Patent No.: US 6,204,528 B1
(45) Date of Patent: Mar. 20, 2001

(54) DYNAMIC RANDOM ACCESS MEMORY STRUCTURE

(75) Inventor: Robin Lee, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/478,328

(22) Filed: Jan. 6, 2000

(51) Int. Cl.[7] .......................... H01L 27/108; H01L 29/76; H01L 29/94; H01L 31/119

(52) U.S. Cl. .......................... 257/302; 257/303; 257/304; 257/306

(58) Field of Search ....................... 438/241, 242, 438/244, 246, 247, 253, 258, 270, 300, 396; 257/302, 303, 304, 306, 308, 330, 331, 334

(56) References Cited

U.S. PATENT DOCUMENTS

| | | | |
|---|---|---|---|
| 5,017,977 | * | 5/1991 | Richardson ........................... 257/316 |
| 5,429,973 | * | 7/1995 | Hong ................................... 438/278 |
| 6,025,221 | * | 2/2000 | Brown .................................. 438/238 |
| 6,075,265 | * | 6/2000 | Goebel et al. ....................... 257/296 |

* cited by examiner

Primary Examiner—Olik Chaudhuri
Assistant Examiner—Hoai Pham
(74) Attorney, Agent, or Firm—Charles C. H. Wu; Charles C. H. Wu & Associates, APC

(57) ABSTRACT

A dynamic random access memory structure. The structure includes a substrate having protruding sections and recessed sections, in which the protruding sections have sidewalls and a substrate surface is located between the protruding sections and the recessed sections. A gate oxide layer is formed on the sidewalls of the protruding sections and on the surfaces between the protruding sections and the recessed sections. A doped region is formed near the bottom of each protruding section, and these doped regions serve as buried bit lines. A channel region is formed in the protruding section and a gate electrode is formed on each side of the channel region. A storage electrode is connected to the other end of the protruding section and a word line is connected to the gate electrode. The word line and the buried bit line are perpendicular to each other.

4 Claims, 5 Drawing Sheets

DYNAMIC RANDOM ACCESS MEMORY STRUCTURE

BACKGROUND OF THE INVENTION

1. Field of the Invention

The present invention relates to a dynamic random access memory (DRAM) structure. More particularly, the present invention relates to a vertical DRAM structure.

2. Description of the Related Art

As the level of integration of semiconductor devices increases, dimensions of circuit devices must be reduced according to design rules. Theoretically, line width of gates can be reduced ad infinitum. In practice, however, line width is limited by the resolution in photolithographic operations as well as length of device channel. Since a source/drain region is formed using the gate line as an ion mask in an ion implantation, line width of the gate is almost equivalent to length of the channel. Although the reduction of channel length is able to increase drifting speed of carriers from one source/drain terminal to the next, the hot carrier effect will intensify resulting in a higher rate of device failure. Hence, an upper limit is set on the possible level of integration for conventional DRAM devices.

SUMMARY OF THE INVENTION

This invention also provides a dynamic random access memory structure. The structure includes a substrate having protruding sections and recessed sections, in which the protruding sections have sidewalls and a substrate surface is located between the protruding sections and the recessed sections. A gate oxide layer is formed on the sidewalls of the protruding sections and on the surfaces between the protruding sections and the recessed sections. A doped region is formed near the bottom of each protruding section, and these doped regions serve as buried bit lines. A channel region is formed in the protruding section and a gate electrode is formed on each side of the channel region. A storage electrode is connected to the other end of the protruding section and a word line is connected to the gate electrode. The word line and the buried bit line are perpendicular to each other. The aforementioned structure further includes a shallow trench isolation structure in the recessed section of the substrate.

Accordingly, the present invention is to provide a dynamic random access memory (DRAM) structure capable of increasing the level of integration for DRAM devices. In addition, the invention also provides a DRAM structure capable of packing more devices onto a piece of silicon chip so that the level of device integration is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
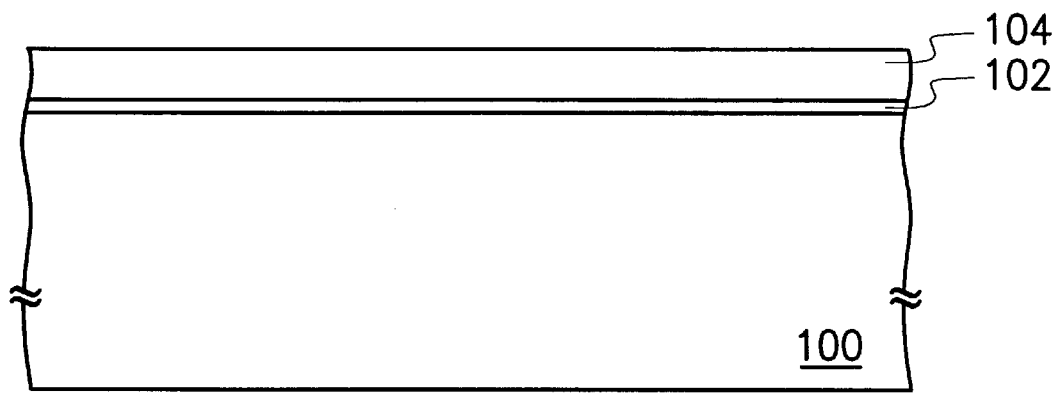
FIGS. 1A through 1I are schematic, cross-sectional views showing the progression of steps for manufacturing flash memory according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1I are schematic, cross-sectional views showing the progression of steps for manufacturing flash memory according to one preferred embodiment of the invention.

As shown in FIG. 1A, a substrate 100 such as a semiconductor silicon substrate is provided. A pad oxide layer 102 and a mask layer 104 are sequentially formed over the substrate 100. The pad oxide layer 102 can be formed by, for example, thermal oxidation. The mask layer 104 can be a silicon nitride layer formed by, for example, chemical vapor deposition.

Figure 1B:
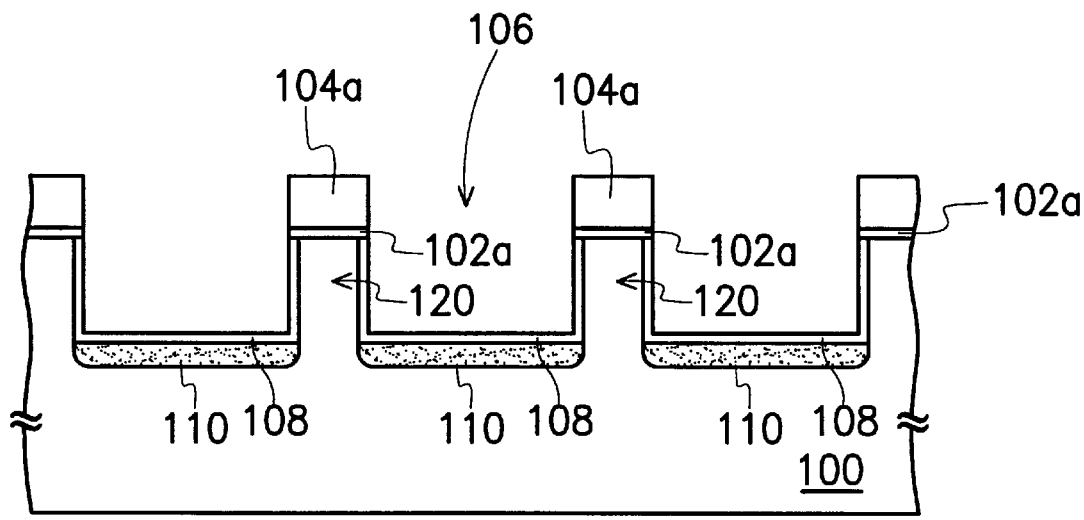

As shown in FIG. 1B, the mask layer 104 is patterned to form a patterned mask layer 104a. Using the patterned mask layer 104a as an etching mask, the pad oxide layer 102 and the substrate 100 are sequentially etched to form openings 106 in the substrate 100. The pad oxide layer 102 becomes a pad oxide layer 102a and the desired regions for forming DRAM cells are patterned out. Regions outside the openings 106 become protruding sections 120. Since depth of the opening 106 is related to the length of device channel, depth of the opening 106 is determined entirely by the length of channel desired. A liner oxide layer 108 is formed over the exposed substrate 100 inside the openings 106. The liner oxide layer 108 can be formed by, for example, thermal oxidation. Using the patterned mask layer 104a as an ion mask, dopants are implanted into the substrate 100 at the bottom of the openings 106 to form a plurality of doped regions 110.

Figure 1C:
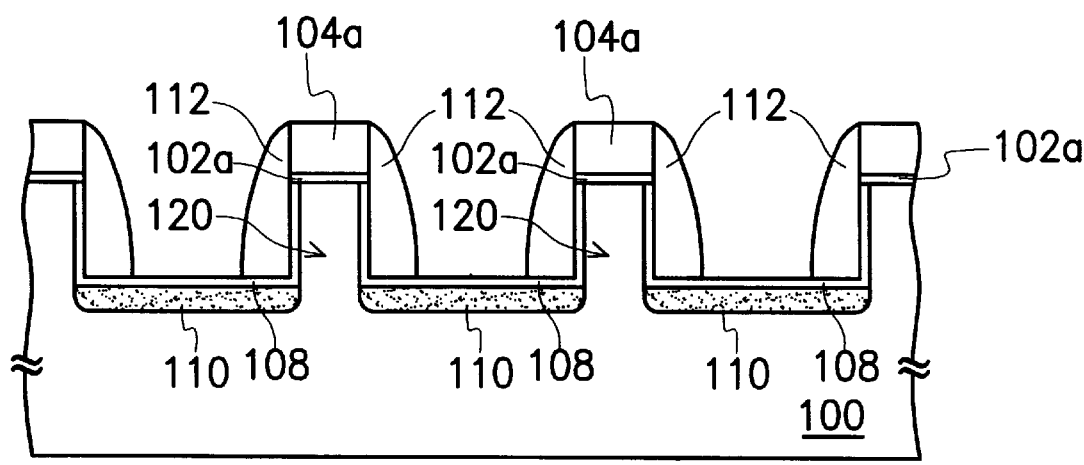

As shown in FIG. 1C, spacers 112 are formed over the liner oxide layer 108 on the sidewalls of the openings 106. The spacers 112 are preferably silicon nitride layers formed by depositing a conformal silicon nitride layer over the substrate 100 and then performing an anisotropic etching of the silicon nitride layer.

Figure 1D:
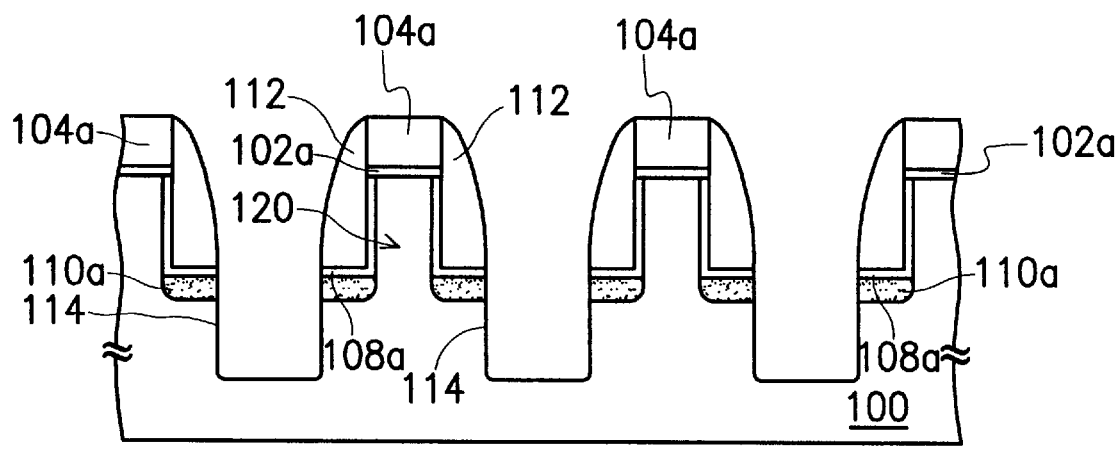
Figure 1E:
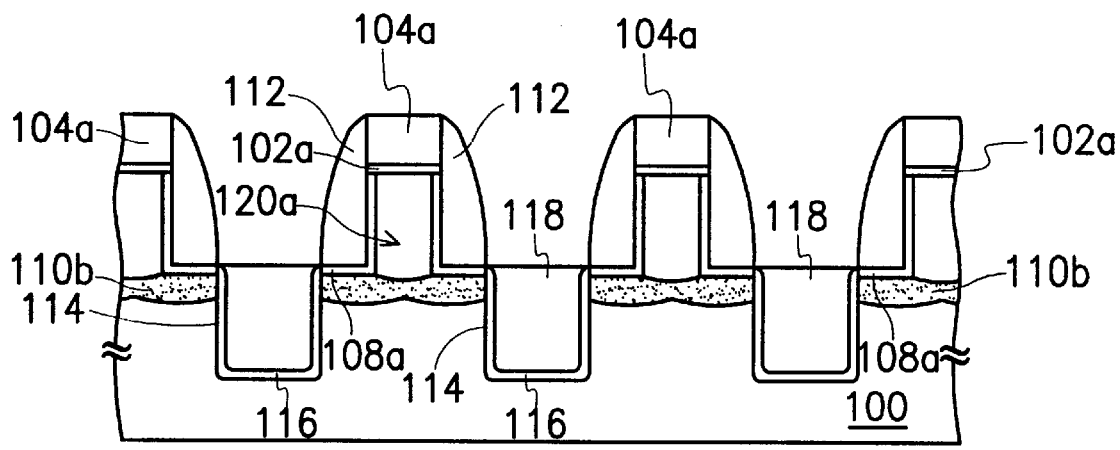

FIGS. 1D and 1E illustrate the steps for forming shallow trench isolation structures. As shown in FIG. 1D, using the patterned mask layer 104a and spacers 112 as an etching mask, the exposed substrate 100 at the bottom of the openings 106 is etched. The liner oxide layer 108 becomes a liner oxide layer 108a and a trench 114 is formed further down each opening 106. Each trench 114 is also defined as a recessed section in this invention. There is a substrate surface between the protruding section 120 and the recessed section. This substrate surface is under the spacers 112. The trenches 114 also have a depth much greater than the thickness of the doped layer 110 so that each doped region 110 is divided into two separate doped regions 110a. Since the dimensions of each trench 114 are determined by the spacers 112 within the opening 106 instead of by a photolithographic process, area occupation of the shallow trench isolation can be reduced without affecting the degree of electrical isolation between devices.

As shown in FIG. 1E, a liner oxide layer 116 is formed over the exposed substrate surface within the trenches 114. The liner oxide layer 116 forms a continuous layer with the liner oxide layer 108a near the upper corners of the trench 114. The liner oxide layer 116 can be formed by, for example, thermal oxidation. An insulation layer 118 is formed inside each trench 114, thereby forming a shallow trench isolation (STI) structure. The STI structures are roughly parallel to the doped regions 110a. The insulation layer can be a silicon oxide layer formed by, for example, depositing oxide material into the openings 106 and the trenches 114, and then etching back the oxide layer so that only the trenches 114 are filled. To increase electrical insulation, a high-temperature annealing operation is carried out to densify the insulation layer 118. The densified insulation layer 118 and the liner oxide layer 116 together function as an STI structure.

Both the formation of the liner oxide layer 116 and the densification of the insulation layer 118 are conducted at an elevated temperature. At a high temperature, dopants in two independent regions 110a bounded within two neighboring STI structures can diffuse towards each other, thereby forming a linked doped region 110b. The doped regions 110b form buried bit lines. Consequently, the protruding sections 120 are separated from the substrate 100 below to become isolated protruding sections 120a. The protruding sections 120a are later transformed into channel regions.

Figure 1F:
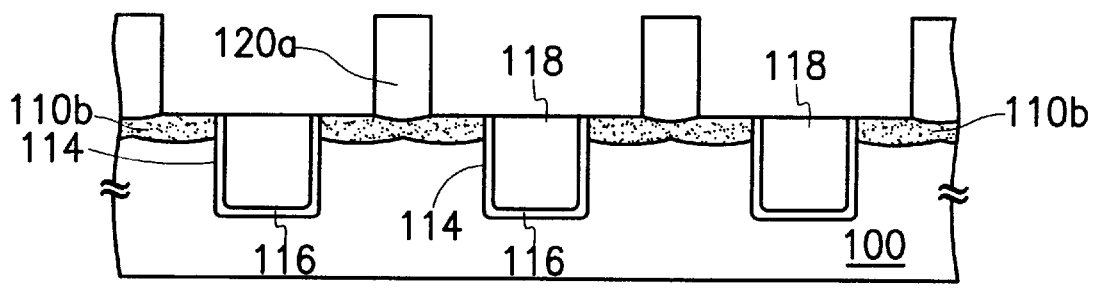

As shown in FIG. 1F, the spacers 112, the patterned mask layer 104a, the pad oxide layer 102a and the liner oxide layer 108a are removed. The spacers 112 and the patterned mask layer 104a can be removed by, for example, wet etching. For example, the spacers 112 and the patterned mask layer 104a are silicon nitride layers, hot phosphoric acid ($H_3PO_4$) solution can be used. The pad oxide layer 102a and the liner oxide layer 108a can be removed by, for example, wet etching using hydrofluoric acid (HF) solution.

Figure 1G:
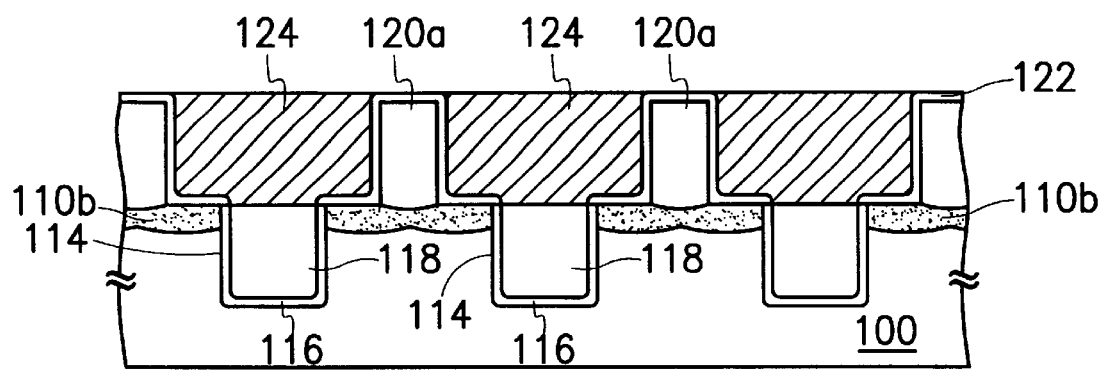
Figure 2:
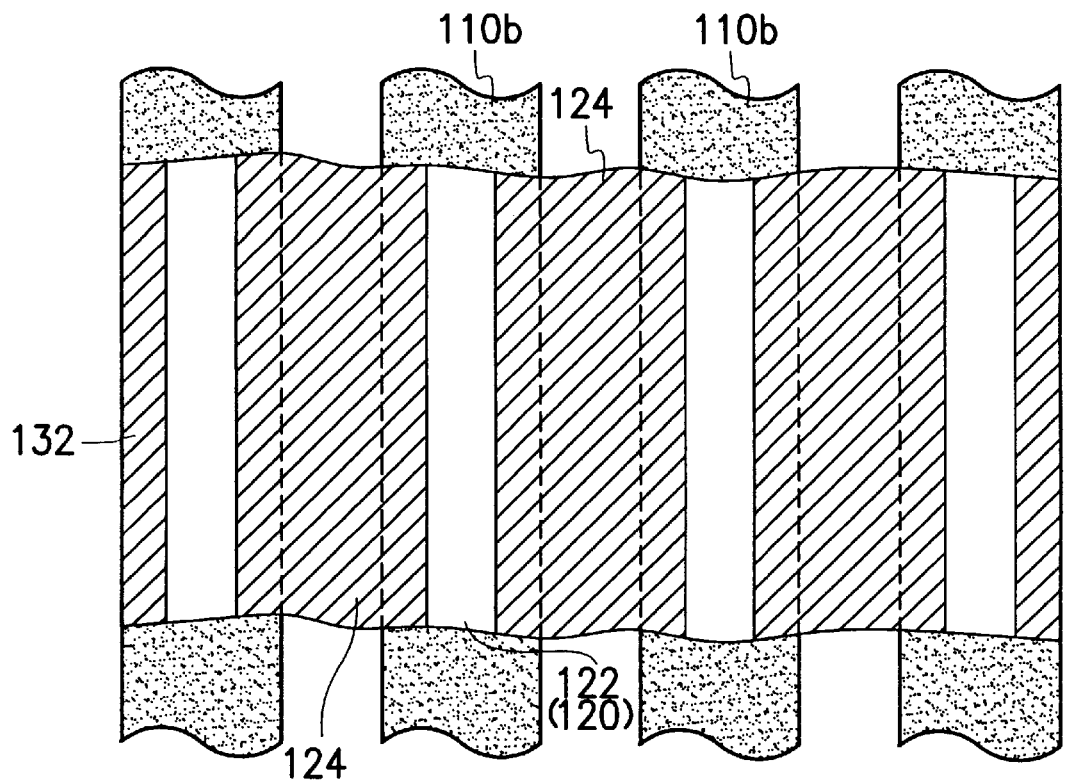
FIG. 2 is a top view of FIG. 1G.

As shown in FIG. 1G, a gate oxide layer 122 is formed over the substrate 100 and in the openings 106. The gate oxide layer 122 can be formed by, for example, thermal oxidation. A conductive layer 124 is formed inside each opening 106. The conductive layer 124 can be a doped polysilicon layer formed by, for example depositing conductive material over the substrate 100 followed by etching back. In this manner, the conductive layer 124 and the neighboring conductive layer 124 are separated by the opening 106. FIG. 2 is a top view of FIG. 1G. The conductive layer 124 inside each opening 106 will eventually become a gate electrode.

Figure 1H:
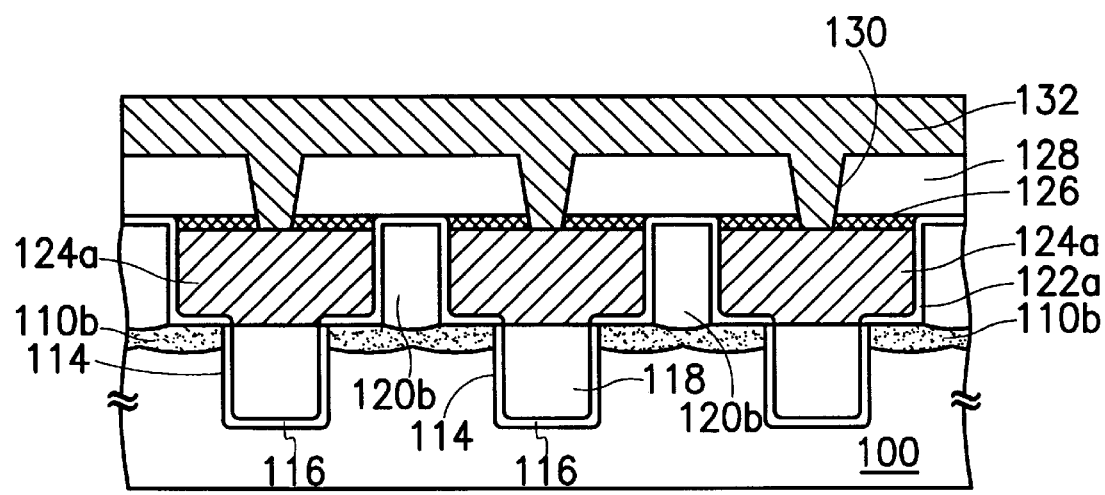
Figure 3:
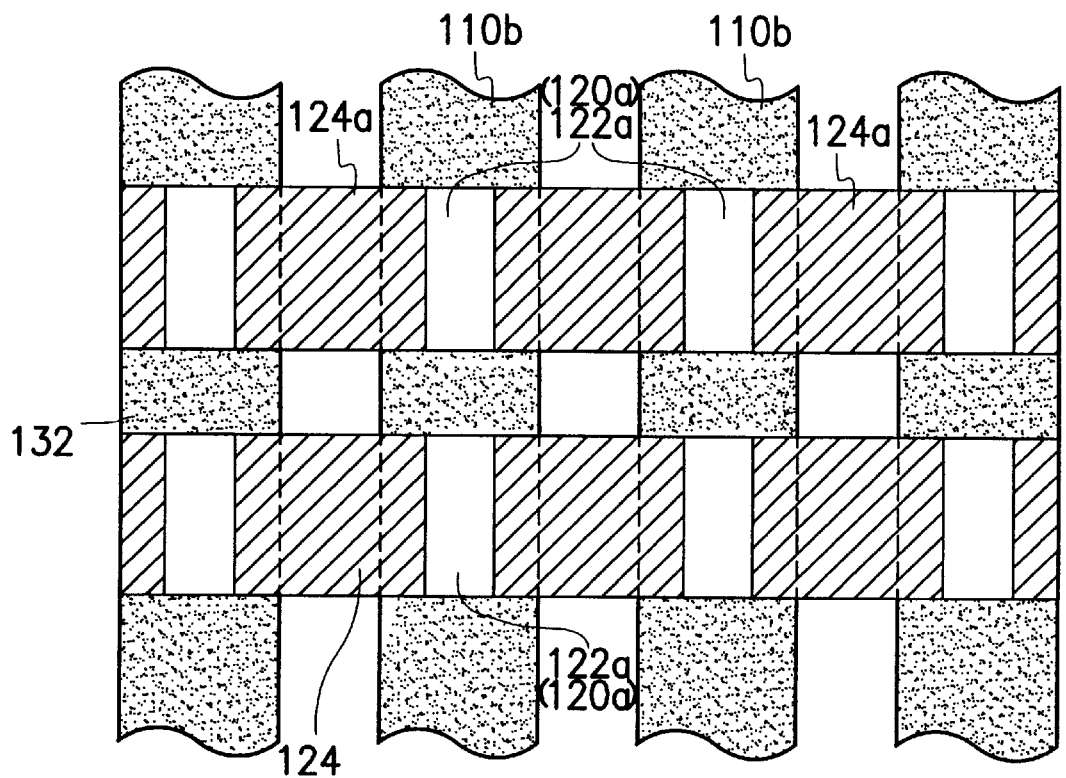
FIG. 3 is a top view of FIG. 1H after the landing pads of word lines are formed.

As shown in FIG. 1H, the conductive layer 124, the gate oxide layer 122 and the protruding sections 120a are patterned to form a conductive layer 124a, a gate oxide layer 122a and channel regions 120b. FIG. 3 is a top view of FIG. 1H after the landing pads of word lines are formed. As shown in FIG. 3, the conductive layer 124a is the landing pad of a word line as well as a gate electrode.

Figure 4:
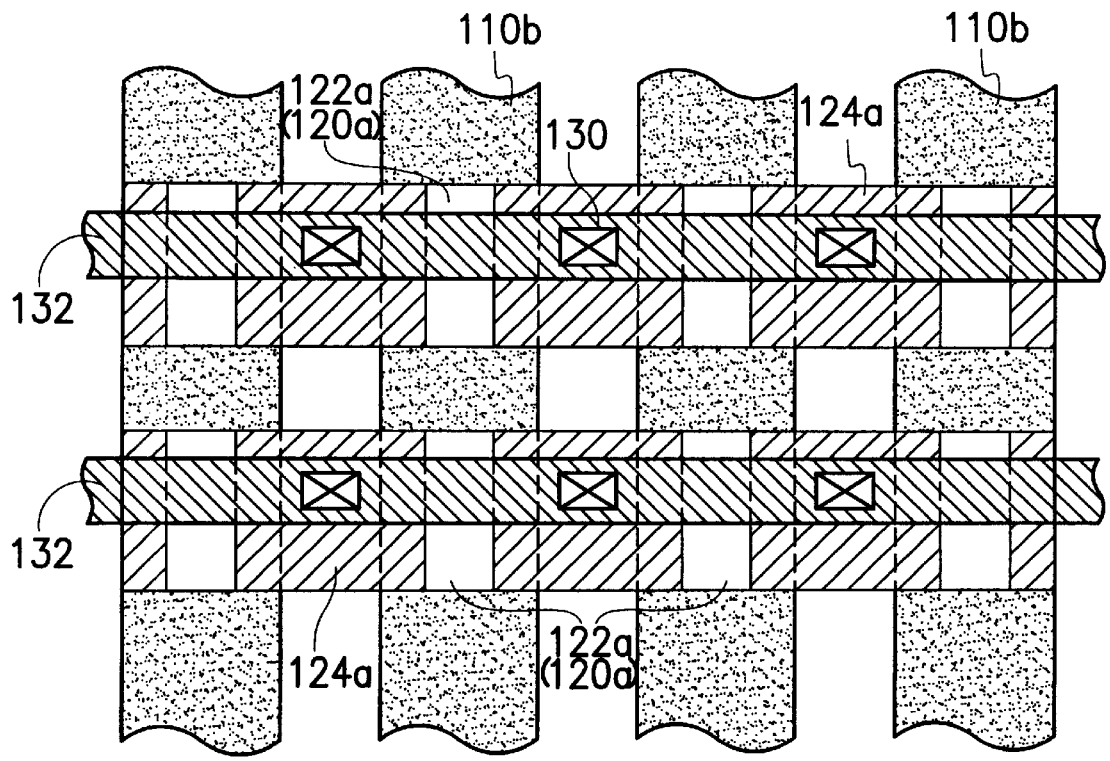
FIG. 4 is a top view of FIG. 1H after the word lines are formed.

A stop layer 126 is formed over the conductive layer 124a. The stop layer 126 can be a silicon nitride layer formed by, for example, nitriding the conductive layer 124a such as a doped polysilicon layer. An insulation layer 128 is formed over the stop layer 126. The insulation layer 128 can be a silicon oxide layer. Contact openings 130 are formed in the insulation layer 128 and the stop layer 126. Word lines 132 are formed over the insulation layer 128. The word lines 132 are electrically connected to the respective landing pads 124a through a contact formed within the opening 130. The word lines 132 can be formed from a material such as aluminum, aluminum-copper alloy or copper. The word lines 132 runs in a direction roughly perpendicular to the doped regions 110b. FIG. 4 is a top view of FIG. 1H after the word lines 132 are formed.

Figure 1I:
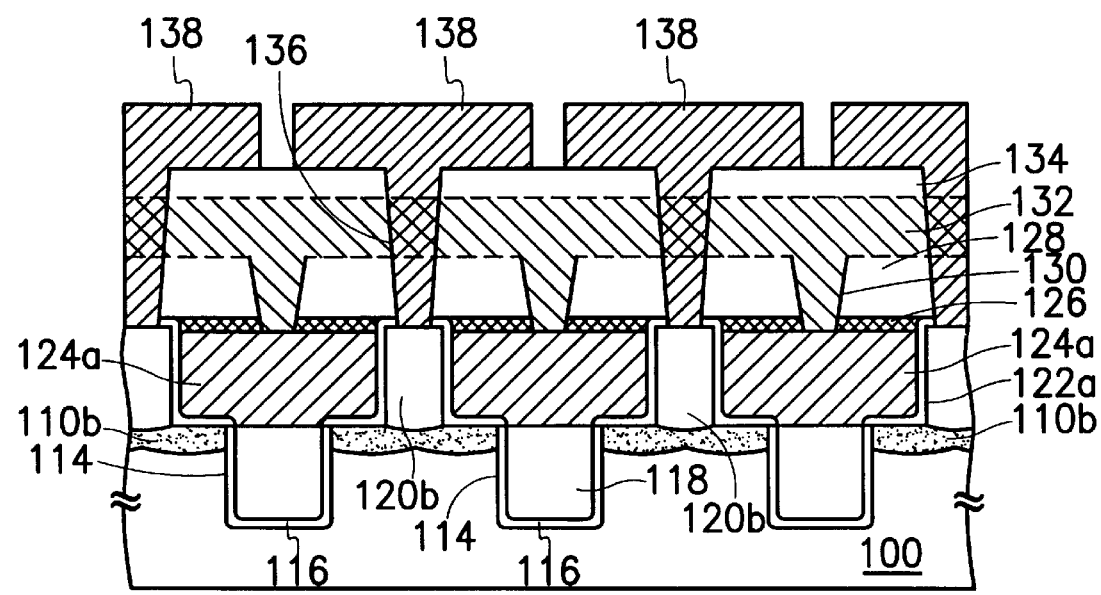
Figure 5:
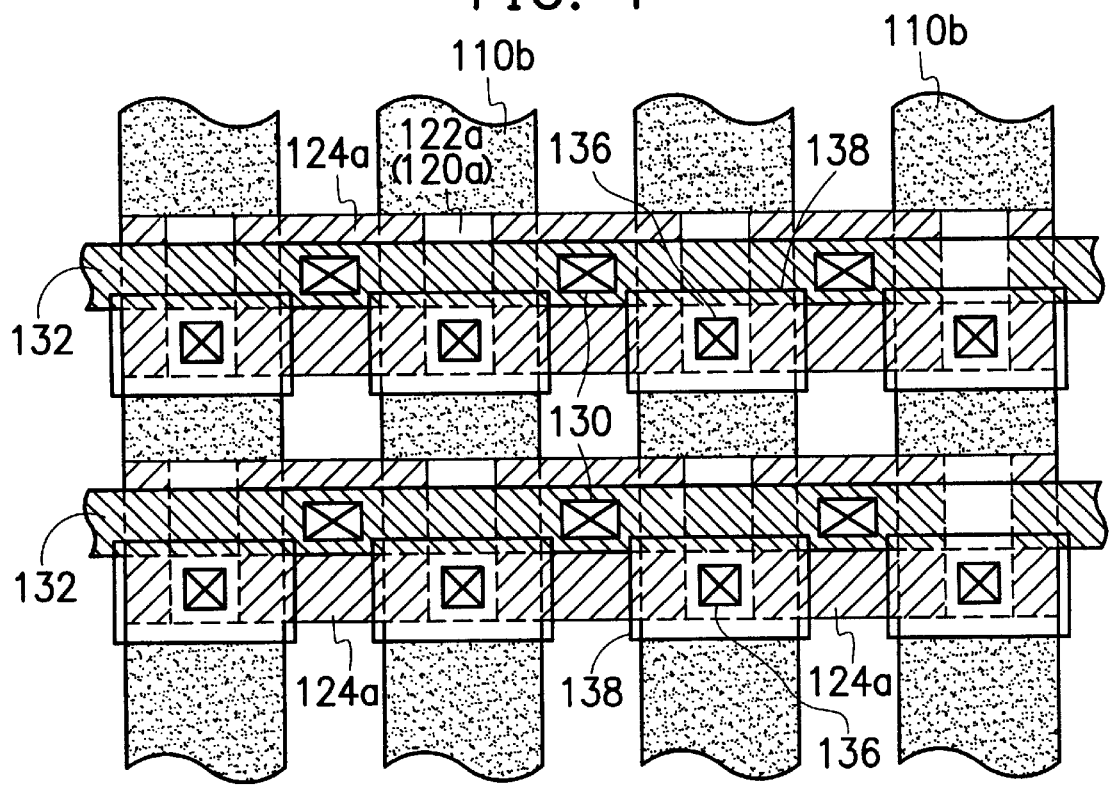
FIG. 5 is a top view of FIG. 1I after the storage electrodes are formed.

As shown in FIG. 1I, an insulation layer 134 is formed over the word lines 132. A node contact opening 136 is formed through the insulation layers 134 and 128. The insulation layer 134 can be a silicon oxide layer. Storage electrodes 138 are formed over the insulation layer 134. The storage electrodes 138 are electrically connected to the respective channel regions 120a through the node contact openings 136. The storage electrodes 138 can be formed using, for example, doped polysilicon. FIG. 5 is a top view of FIG. 1I after the storage electrodes 138 are formed. In FIG. 1I, the word lines 132 and the storage electrodes 138 are drawn in the same cross-section. In reality, the word lines 132 and the storage electrodes 138 are separate and independent.

In the subsequent operation, steps for forming capacitors and interconnects are carried out. Since these steps are not directly related to this invention, detailed descriptions are omitted here.

The DRAM formed according to method of this invention works in a manner similar to a conventional DRAM. The only difference is that each DRAM cell in this invention is simultaneously controlled by the gate electrodes 124a on each side of the channel region 120b. Consequently, data accessing and reading is faster.

In summary, the advantages of this invention include:

1. Only current semiconductor manufacturing techniques are used. Moreover, the DRAM structure of this invention is formed in a vertical direction, and hence the level of integration can be increased.

2. Steps for forming the DRAM structure are simple. In addition, self-aligned processes are often used. flence, the number of photomasks required is greatly reduced and cost of production is lowered.

3. The DRAM cell of this invention is simultaneously controlled by the gate electrodes on each side of the channel region. Therefore, reading and data accessing can be faster.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dynamic random access memory structure, comprising:

a substrate that includes protruding sections and recessed sections;

a gate oxide layer on the protruding sections and on the recessed sections a doped region at a bottom end of each protruding section, wherein the doped region functions as a buried bit line;

a channel region in each protruding section;

a pair of gate electrodes, one on each side of the channel region;

a storage electrode electrically connected to another end of the protruding section; and a word line electrically connected to the gate electrode, wherein the word line runs in a direction perpendicular to the buried bit line.

2. The structure of claim 1, wherein a material for forming the storage electrode includes doped polysilicon.

3. The structure of claim 1, wherein each recessed section further includes a shallow trench isolation structure.

4. The structure of claim 1, wherein a material for forming the gate electrode includes doped polysilicon.

* * * * *